United States Patent [19]

Yamamoto et al.

[11] Patent Number: 4,467,027
[45] Date of Patent: Aug. 21, 1984

[54] PROCESS OF DEVELOPING POSI-TYPE LITHOGRAPHIC PRINTING PLATE WITH INORGANIC ALKALI SOLUTION

[75] Inventors: Takeshi Yamamoto; Kiyoshi Goto; Yoshio Kurita; Noriyasu Kita; Naoshi Kunieda, all of Hino, Japan

[73] Assignee: Konishiroku Photo Industry Co., Ltd., Tokyo, Japan

[21] Appl. No.: 380,119

[22] Filed: May 20, 1982

[30] Foreign Application Priority Data

May 25, 1981 [JP] Japan .................... 56-79056

[51] Int. Cl.$^3$ .............................. G03F 7/08
[52] U.S. Cl. ................... 430/302; 430/165; 430/175; 430/176; 430/192; 430/309; 430/278; 430/428; 430/429; 430/490
[58] Field of Search ........... 430/331, 326, 309, 192, 430/490, 428, 429, 302, 175, 176, 165, 325, 278

[56] References Cited

U.S. PATENT DOCUMENTS

| | | | |
|---|---|---|---|
| 2,606,118 | 8/1952 | Rogers | 430/490 |
| 3,549,370 | 12/1970 | Sykes et al. | 430/490 |
| 3,666,473 | 5/1972 | Colom et al. | 430/192 |
| 3,713,826 | 1/1973 | Sykes et al. | 430/490 |
| 3,868,254 | 2/1975 | Wemmers | 430/192 |
| 4,115,128 | 9/1978 | Kita | 430/192 |
| 4,141,733 | 2/1979 | Guild | 430/331 |
| 4,259,434 | 3/1981 | Yamasue et al. | 430/309 |
| 4,294,911 | 10/1981 | Guild | 430/331 |

Primary Examiner—Charles L. Bowers, Jr.
Attorney, Agent, or Firm—Frishauf, Holtz, Goodman & Woodward

[57] ABSTRACT

A developer composition of an alkaline aqueous solution containing a reducing inorganic salt, typically an alkali metal salt of sulfurous acid such as sodium sulfite, is found to be applicable for development of a lithographic printing plate material containing a photosensitive o-quinonediazide compound and an organic polymer, with reduced deterioration in developing capacity caused by the air and enhanced stability with lapse of time. In particular, a developer composition composed of an alkaline aqueous solution of pH 11 or higher containing a water-soluble sulfurous acid salt is effective for developing both of a lithographic printing plate material having a nega-type photosensitive layer containing a photosensitive diazo compound and an organic polymer, and a lithographic printing plate material having a posi-type photosensitive layer containing an o-quinonediazide compound and an organic polymer.

19 Claims, No Drawings

PROCESS OF DEVELOPING POSI-TYPE LITHOGRAPHIC PRINTING PLATE WITH INORGANIC ALKALI SOLUTION

This invention relates to a developer composition for lithographic printing plate materials, more particularly to a developer composition for treating a lithographic printing plate material having a photosensitive layer containing an o-quinonediazide compound and an organic polymer after exposure to active rays thereby to remove the non-image portion.

It is known in the art that an o-quinonediazide compound can be irradiated by active rays to be decomposited into a carboxylic acid of a five-membered ring and thus rendered alkali soluble. Accordingly, there have widely been used for lithographic printing materials o-quinonediazide compounds as photosensitive components for obtaining posi-posi type images. Compositions comprising mixtures of such o-quinonediazide compounds with organic polymers have generally been employed for enabling a large number of printings through enhancement of the physical strength of the image portion of the imprinting plate. A lithographic printing plate material having a photosensitive composition containing an o-quinonediazide compound provided therein is exposed to active rays through a transparent positive film and then developed with an aqueous alkali solution, whereby only non-irradiated portions will remain on the support to produce a posi-posi type relief image. As the aqueous alkali solution to be used in developing, there have been employed aqueous solutions such as of sodium hydroxide, sodium silicate, sodium phosphate, etc.

However, when these aqueous alkali solutions are left to stand in the air, there may be caused lowering in developing capacity by carbon dioxide gas in the air. In particular, in the vat development in which a large area is contacted with the air, deterioration of the developer is especially marked. Further, a developer composition for a posi-type lithographic printing plate material, which is generally strongly alkaline in nature, may sometimes cause coupling reaction of o-quinonediazide compound in the halftone of the image portion to form a red dyestuff, which dyestuff may sometimes remain on the support after developing and washing with water. In this case, the edge portion of the image may poorly be contrasted to lower resolving power, thereby causing sometimes overlapping of dots especially at the shadow portion.

Therefore, an object of the present invention is to provide a developer composition for a lithographic printing plate material having a posi-type photosensitive layer containing a photosensitive o-quinonediazide compound and an organic polymer, which is improved in the drawback of lowering of treatment capacity by the air and also excellent in stability with lapse of time.

Another object of the present invention is to provide a developer composition suitable for a lithographic printing plate material containing a photosensitive o-quinonediazide compound and an organic polymer, which is excellent in resolving power as well as in halftone dot reproducibility.

Other objects of the present invention will be apparent as the description proceeds in the specification hereinbelow. The present inventors have made extensive studies to achieve the above objects and at last accomplished the present invention.

The present invention is a developer composition for a lithographic printing plate material containing a photosensitive o-quinonediazide compound and an organic polymer, characterized in that it is an alkaline aqueous solution containing a reducing inorganic salt.

The present invention is to be described in detail below.

The o-quinonediazide compound for which the developer composition of the present invention can be applied is a compound having at least one o-quinonediazide group, including those compounds with various known structures, as described in detail in, for example, "Light-Sensitive Systems" written by J. Kosar (John Wiley & Sons, Inc., 1965), pp. 339–353. In particular, there may preferably be employed esters of various hydroxyl compounds with and o-quinonediazidesulfonic acid. As preferable hydroxyl compounds, there may be mentioned condensation resins of a phenol compound with a compound having an active carbonyl group preferably novolac resins, among which phenol-formaldehyde resins, cresol-formaldehyde resins, and resorcin-benzaldehyde resins as well as pyrogallol-acetone resins are preferred.

Typical examples of the o-quinonediazide compound may include esters obtainable from benzoquinone-(1,2)-diazidesulfonyl chloride or naphthoquinone-(1,2)-diazidesulfonyl chloride and phenol-formaldehyde resins or cresol-formaldehyde resins; sulfonic acid esters obtainable from naphthoquinone-(1,2)-diazidesulfonyl chloride and pyrogallol-acetone resins as disclosed in U.S. Pat. No. 3,635,709; condensates between naphthoquinone-(1,2)-diazide-(2)-5-sulfonyl chloride and resorcin-benzaldehyde resins as disclosed in Japanese Provisional Patent Publication No. 1044/1981; and ester compounds of naphthoquinone-(1,2)-diazide-(2)-5-sulfonyl chloride with resorcin pyrogallol-acetone co-condensates. Other useful o-quinonediazide compounds may also include polyesters having terminal hydroxyl groups esterified with o-naphthoquinonediazidesulfonyl chloride as disclosed in Japanese Provisional Patent Publication No. 117503/1975; homopolymers of p-hydroxystyrene or its copolymers with other copolymerizable monomers esterified with o-naphthoquinonediazidesulfonyl chloride as disclosed in Japanese Provisional Patent Publication No. 113305/1975; esterified products between bisphenol-formaldehyde resins and o-quinonediazidesulfonyl chloride as disclosed in Japanese Patent Publication No. 29922/1979; condensates of copolymers of alkyl acrylate, acryloyloxyalkyl carbonate and hydroxyalkyl acrylate with o-quinonediazidesulfonyl chloride as disclosed in U.S. Pat. No. 3,859,099; reaction products between the polymer products of styrene-phenol derivatives and o-quinonediazidesulfonic acid as disclosed in Japanese Patent Publication No. 17481/1974; copolymers of p-aminostyrene with other copolymerizable monomers amidated with o-naphthoquinonediazidesulfonic acid or o-naphthoquinonediazidecarboxylic acid as disclosed in U.S. Pat. No. 3,759,711; and esterified products between polyhydroxybenzophenones and n-naphthoquinonediazidesulfonyl chloride. The content of the o-quinonediazide compound may generally be 5 to 80% by weight, preferably 10 to 50% by weight based on the total solids in the photosensitive composition.

The organic polymer to be used as a mixture with the above o-quinonediazide compound refers to an alkali soluble resin. Suitable alkali soluble resins may be exemplified by phenol-formaldehyde resins, cresol-formaldehyde resins; phenol-cresol-formaldehyde copolycondensates as disclosed in Japanese Provisional Patent Publication No. 57841/1980; copolycondensates between p-substituted phenol, phenol or cresol with formaldehyde as disclosed in Japanese Provisional Patent Publication No. 127553/1980; condensates of polyhydric phenols such as resorcin-benzaldehyde resins, pyrogallol-benzaldehyde resins etc. with benzaldehyde; copolycondensates of polyhydric phenols such as pyrogallol-resorcinacetone resins, etc. with acetone; xylenol-formaldehyde resins; shellac; rosins; resins having carboxyl groups such as styrene-maleic anhydride copolymers, polyacrylic acid, polymethacrylic acid, acrylic acid copolymers, methacrylic acid copolymers, methacrylic acid-styrene copolymers, etc.; polyparahydroxystyrene; copolymers containing p-hydroxymethacrylanilide derivatives as disclosed in Japanese Patent Publication No. 34931/1977; copolymers containing hydroquinone monomethacrylate derivatives as disclosed in Japanese Patent Publication No. 41052/1977; and mixtures thereof. It is particularly preferred to use a novolac resin such as cresol-formaldehyde resin or a phenol-cresol-formaldehyde copolycondensate resin.

There may also be added various additives in the above photosensitive layer, if desired. For example, there may be employed oleophilic phenol-formaldehyde resins for improvement of ink acceptivity, surfactants for improvement of coating characteristics, plasticizers for improvement of flexibility of coated films, and further printout materials capable of forming visible image (comprising compounds capable of generating acids or free radicals by exposure to light and organic dyes for changing their tones through interaction with said compounds).

The photosensitive composition containing components as described above is dissolved in an organic solvent and coated on a support to provide a lithographic printing plate material for which the developer composition according to the present invention is applied. As organic solvents, there may be employed methyl cellosolve, ethyl cellosolve, methyl cellosolve acetate, ethyl cellosolve acetate, cyclohexane, methyl ethyl ketone, toluene, ethyl acetate, dimethylformamide, dimethyl sulfoxide, ethylene dichloride, etc. which may be used either along or as a mixture.

As a support, there may be mentioned a metal plate, such as of aluminum, zinc, copper, etc.; a metal having vapor deposited zinc, copper, chromium, etc. thereon; a paper; a plastic; a paper or a plastic having a metal vapor deposited thereon. Among them, an aluminum plate is most preferred. Particularly, in case of an aluminum plate, it is preferred to have a surface treatment such as sand graining treatment, anodic oxidation treatment and, if necessary, sealing treatment, etc., thereon. More specifically, there may be employed an aluminum plate which has been subjected to sand graining treatment according to the brush polishing method, and then to etching treatment in a nitric acid system electrolyte followed by alkalietching and then anodic oxidation. As the sand graining treatment, an aluminum plate may be defatted on its surface and thereafter subjected to brush polishing, ball polishing, chemical polishing or electrolytic etching, etc.

The anodic oxidation may be carried out by passing current, using an aluminum plate as anode, through an electrolyte of an aqueous or non-aqueous solution containing one or a combination of two or more of inorganic acids such as phosphoric acid, chromic acid, boric acid, sulfuric acid, etc., or organic acids such as oxalic acid, sulfamic acid, etc. Further, sealing treatment may be conducted by immersing the plate in an aqueous sodium silicate solution, hot water or a hot aqueous solution containing a small amount of an inorganic salt or an organic salt or alternatively in a steam bath.

The alkaline aqueous solution to be used in the present invention is an aqueous solution containing as an alkali agent, an inorganic alkali agent such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium carbonate, potassium carbonate, sodium hydrogen carbonate, or an organic amine compound such as monoethanolamine, diethanolamine, triethanolamine, etc. Among them, an alkali silicate (e.g. sodium silicate and potassium silicate), especially an alkali metasilicate (e.g. sodium metasilicate and potassium metasilicate) is preferred.

The reducing inorganic salt to be used in the present invention has a reducing action and may preferably be a water-soluble inorganic salt, particularly a salt of lower oxyacid. For example, there may be mentioned sulfites such as sodium sulfite, potassium sulfite, ammonium sulfite, lithium sulfite, magnesium sulfite, sodium hydrogen sulfite, potassium hydrogen sulfite, etc; and phosphites such as sodium phosphite, potassium phosphite, sodium hydrogen phosphite, potassium hydrogen phosphite, sodium dihydrogen phosphite, potassium dihydrogen phosphite, etc. These may be used singly or as mixtures. Among them, an alkali metal salt of sulfurous acid is more preferred. The content of these reducing inorganic salts may be 0.001 to 30% by weight of the developer composition, preferably 0.01 to 10% by weight. There may also be added, if desired, an anionic surfactant or an amphoteric surfactant in said developer composition. Further, although water is generally used as the solvent, there may also be added an organic solvent such as alcohols in the developer composition according to the present invention.

As anionic surfactants, there may be employed alkylbenzenesulfonates (said alkyl moiety having 8–18, preferably 12–16 carbon atoms) such as sodium dodecylbenzene sulfonate; alkyl naphthalenesulfonates (said alkyl moiety having 3–10 carbon atoms) such as sodium isopropylnaphthalenesulfonate; formalin condensates of naphthalenesulfonates; dialkyl-sulfosuccinates (said alkyl moiety having 2–18 carbon atoms), dialkylamide sulfonates (said alkyl moiety having 11–17 carbon atoms).

As the amphoteric surfactants, there may be included betaine type compounds as exemplified by imidazoline derivatives such as N-alkyl-N,N,N-tris(carboxymethyl)ammonium (said alkyl moiety having 12–18 carbon atoms), N-alkyl-N-carboxymethyl-N,N-dihydroxyethyl ammonium (said alkyl moiety having 12–18 carbon atoms). The content of such a surfactant in the developer composition may be within the range of from about 0.005 to about 3% by weight.

Further, as the organic solvent, there may be employed benzyl alcohol, methanol, ethanol, isopropyl alcohol, 2-methoxy ethanol, 2-ethoxy ethanol, 2-butoxy ethanol, ethylene glycol, polyethylene glycol, etc. Among them, benzyl alcohol is preferred and the preferable content thereof in said developer composition is within 5% by weight. There may also be added a defoaming agent such as organic silane compounds.

The developer composition of the present invention may have a pH of 11 or more, preferably 12 or more.

Further, there may also be applied in the present invention the developing method as disclosed in Japanese Provisional Patent Publication No. 22759/1980 wherein the fatigue or deterioration of a developer composition is compensated by addition of a supplementary solution comprising an aqueous alkali metal silicate to said developer composition. It is also possible to apply the present invention for the method for preparation of a printing plate as disclosed in Japanese Provisional Patent Publication No. 12921/1980 wherein the printing plate material subjected to developing with an aqueous alkali solution and squeezing is coated immediately without application of the washing step, with a protective gum solution.

By using the developer composition according to the present invention for development of a lithographic printing plate material subjected to imagewise exposure, there can be effected improvement of treatment capacity through alleviation of the air fatigue. Also, color formation by the coupling reaction of an o-quinonediazide compound can be reduced to give an image excellent in resolving power as well as in dot reproducibility.

Further, in an embodiment where the developer composition of the present invention contains an organic solvent as described above and a water-soluble sulfite is used as the reducing inorganic salt, as well as in an embodiment where the composition contains both of the aforesaid organic solvent and a surfactant as a solubilizing agent for the solvent and a water soluble sulfite is used as the reducing inorganic salt, the same developer composition was also found to be capable of developing a lithographic printing plate material having a nega-type photosensitive layer containing a photosensitive diazo compound and an organic polymer with an acid value of 10 to 300. Lithographic printing plate materials having nega-type photosensitive layers, which have been widely used in the market equally as the lithographic printing plate materials having posi-type photosensitive layers, require developer compositions which are different from those for lithographic printing plate materials having posi-type photosensitive layers, due to the difference in developer compositions. Hence, in most cases, it is required to have a plural number of developing treatment devices, whereby large installation cost as well as installation space were required.

For this reason, it is especially desirable to have a developer composition which can be utilized for both of a lithographic printing plate material having a nega-type photosensitive layer and a lithographic printing plate material having a posi-type photosensitive layer. With the use of the composition according to the present invention, when both of a lithographic printing plate having a nega-type photosensitive layer and a lithographic printing plate having a posi-type photosensitive layer are to be treated, it has been made possible to omit cumbersome operations such as preparation of developer compositions adapted for respective materials, replacement of the developer compositions or previous preparation of two kinds of developer compositions and developing treatment devices, whereby marked improvements have been achieved with respect to operation efficiency, installation cost, installation space, etc.

Further, even when containing substantially none of an organic solvent and a surfactant, if the organic polymer has an acid value of 35 to 300, it has been found possible to develop a lithographic printing material having a nega-type photosensitive layer containing a photosensitive diazo compound and an organic polymer having an acid value of 35 to 300. Such a developer composition containing substantially none of organic solvents and surfactants is very favorable with respect to the problems in hygiene such as toxicity, odor, etc., the problems in safety such as fire, gas explosion, etc., further pollution by wasteliquors, cost and others.

The organic polymer to be contained in the above nega-type photosensitive layer may include, for example, acrylic acid copolymers, methacrylic acid copolymers, crotonic acid copolymers, itatonic acid copolymers maleic acid copolymer, cellulose derivatives having carboxyl groups in the side chains, polyvinyl alcohol derivatives having carboxyl groups in the side chains, hydroxyalkyl acrylate or methacrylate copolymers having carboxyl groups in the side chains, unsaturated polyester resins having carboxyl groups, and so on.

Among them, preferable polymers are those comprising monomer units having aromatic hydroxyl groups and structural units represented by the formula (II):

wherein $R_3$ is a hydrogen atom or a methyl group, and having an acid value of 5 to 300, or those comprising the structural units represented by the formula (I):

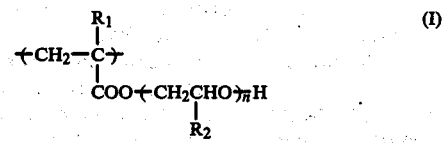

wherein $R_1$ is a hydrogen atom or a methyl group; $R_2$ a hydrogen atom, a methyl group, a chloromethyl group or an ethyl group; and n an integer of 1 to 10, and the structural units represented by the above formula (II), and having an acid value of 5 to 300.

More specifically, there may be included (A) polymers comprising monomer units having aromatic hydroxyl groups, the structural units represented by the above formula (II) and the structural units derived from an α, β-unsaturated carboxylic or sulfonic acid, which may further optionally contain other structural units derived from an addition polymerization type unsaturated compound, and having an acid value of 5 to 300; (B) polymers comprising the structural units represented by the above formula (I), the structural units represented by the above formula (II) and the structural units derived from an α, β-unsaturated carboxylic or sulfonic acid, which may further optionally contain other structural units derived from an addition polymerization type unsaturated compound, and having an acid value of 5 to 300; (C) polymers comprising monomer units having aromatic hydroxyl groups and the structural units represented by the above formula (II), which may further optionally contain other structural units derived from an addition polymerization type unsaturated compound, said polymers being modified by reaction with a cyclic acid anhydride to the form of half-esters and having an acid value of 5 to 300; and (D) polymers comprising the structural units represented by the above formula (I) and the structural units represented by the above formula (II), which may further optionally contain other structural units derived from an addition polymerization type unsaturated compound, said polymers being modified by reaction with a cyclic acid anhydride to the form of half-esters and having an acid value of 5 to 300.

As the monomers providing monomer units having aromatic hydroxyl groups, there may be mentioned, for example, N-(4-hydroxyphenyl)acrylamide, N-(4-hydroxyphenyl)methacrylamide, N-(4-hydroxynaphthyl)methacrylamide, o-, m- or p-hydroxyphenyl acrylate, o-, m- or p-hydroxyphenyl methacrylate, o-, m- or p-hydroxystyrene, and the like.

As the monomers providing the structural units represented by the formula (I), there may be mentioned, for example, hydroxyethyl acrylate, 2-hydroxybutyl acrylate, 3-chloro-2-hydroxypropyl acrylate, di-, tri- or tetra-ethylene glycol monoacrylate, mono-, di-, or tetrapropylene glycol monomethacrylate, 2-hydroxybutyl methacrylate.

Typical examples of α, β-unsaturated carboxylic or sulfonic acids, which are used for deriving the above-mentioned structural units, may include acrylic acid, methacrylic acid, ethacrylic acid, maleic acid anhydride, methylmaleic acid anhydride, phenylmaleic acid anhydride, crotonic acid, itaconic acid, vinylbenzoic acid, sorbic acid, cinnamic acid, allylsulfonic acid, vinylsulfonic acid, vinylbenzenesulfonic acid, mono-2-hydroxyethyl itaconate, mono-2-hydroxypropyl itaconate, mono-2-hydroxyethyl citraconate, mono-2-hydroxyethyl aconitate, mono-2-hydroxyethyl maleate, mono-2-hydroxyethyl fumarate, monomethyl itaconate, monoethyl itaconate, and the like.

As the addition polymerizable unsaturated compound as mentioned above, there are acrylic acid esters, acrylamides, methacrylic acid esters, methacrylamides, allyl compounds, vinyl ethers, vinyl esters, styrenes, crotonic acid esters, and the like, which are selected from compounds having one addition polymerizable unsaturated bonding.

As the cyclic acid anhydride to be half-esterified as mentioned above, there may be mentioned phthalic acid anhydride, tetrahydrophthalic acid anhydride, hexahydrophthalic acid anhydride, 3,6-endomethylene-Δ⁴-tetrahydrophthalic acid anhydride, 3,6-endooxy-Δ⁴-tetrahydrophthalic acid anhydride, tetrachlorophthalic acid anhydride, maleic acid anhydride, chloromaleic acid anhydride, succinic acid anhydride, n-dodecylsuccinic acid anhydride, and the like.

The organic polymer contained in a nega-type photosensitive layer for which the developer composition containing substantially none of organic solvents and surfactants has an acid value of 35 to 300, preferably 40 to 250, more preferably 45 to 200. When the acid value is lower than the range as specified above, developing characteristics are poor with a tendency to give rise to staining and overlapping at the shadow portion. On the other hand, with an acid value higher than said range, in spite of improvement of the developing characteristics, the printing ink is worsened in inking performance, causing troubles particularly in practical operations in printing at lower temperatures.

The content of the monomer units having aromatic hydroxyl groups or the structural units represented by the formula (I) in the organic polymer as described above may generally be 10 to 80% by weight, preferably 15 to 60% by weight. The content of the structural units represented by the formula (II) may generally be 5 to 60% by weight, preferably 10 to 40% by weight.

The organic polymer as described above can readily be prepared generally in the presence of a polymerization initiator conventionally used and there may be employed a polymer having a molecular weight of about 10,000 to 500,000.

Such an organic polymer may suitably be incorporated in an amount of about 40 to 99% by weight in the photosensitive layer, preferably 55 to 95% by weight to give more favorable results.

The photosensitive diazo compound to be used in the nega-type photosensitive layer may include aromatic diazonium salts and diazo resins, typically condensates of aromatic diazonium salts with active carbonyl compounds, especially formaldehyde. Among them, diazo resins soluble in organic solvents are particularly preferred.

As diazo resins, there may be included, for example, diazo resin inorganic salts which are reaction products soluble in organic solvents between condensates of p-diazodiphenylamine with formaldehyde or acetaldehyde and hexafluorophosphates, tetrafluoroborates, perchlorates, periodates, etc.; or diazo resin organic acid salts soluble in organic solvents as disclosed in U.S. Pat. No. 3,300,309 which are reaction products between the aforesaid condensates and sulfonic acids, such as p-toluenesulfonic acid or salts thereof, phosphinic acids such as benzenephosphinic acid or salts thereof, hydroxyl containing compounds such as 2,4-di-hydroxybenzophenone, 2-hydroxy-4-methoxy-benzophenone-5-sulfonic acid or salts thereof.

The content of the photosensitive diazo compound in the nega-type photosensitive layer may be 1 to 30% by weight, preferably 3 to 15% by weight.

In the nega-type photosensitive layer, there may be added various additives for improvement of its performance as exemplified below:
 (I) plasticizers for imparting flexibility and abrasion resistance of coated films;
 (II) colorants for visualization of images;
 (III) optical color forming substances for visualization by exposure to light;
 (IV) lipid sensitive agents for improvement of ink acceptivity at the image portions.

These additives may be added generally in an amount of 0.01 to 30% by weight based on the total solids in the photosensitive layer.

For preparation of a lithographic printing plate material by providing such a nega-type photosensitive layer on a support, an organic polymer, a diazo compound and, if desired, various additives as described above may be added in predetermined amounts in an appropriate solvent to be dissolved therein to prepare a photosensitive solution, which is in turn coated on a support, followed by drying. The amount of the photosensitive layer coated may be approximately 0.2 to 10 g/m².

As the support on which a nega-type photosensitive layer is to be provided, there may be used the same kind of support as described above for providing a posi-type photosensitive layer thereon, but it is preferred to use an aluminum plate, having applied sand graining treatment thereon, which is subjected to anodic oxidation and then to sealing treatment.

The wording "containing substantially none" of the aforesaid solvents means that they are not contained in amounts to the extent such that the effects in hygiene, safety, cost, etc., might be impaired. Generally speaking, there is no problem at a level of 1% by weight or less in the developer composition. A preferable content of an organic solvent is 0.5% by weight or less, and the embodiment containing no such solvent at all is more preferable. When the developer composition contains substantially no organic solvent, it is not essentially required to contain a surfactant. With respect to surfactants, a content of 0.1% by weight or less may cause little problem in pollution, etc., but a preferred embodiment should contain no such surfactant at all.

As water-soluble sulfites to be used in the embodiment of the developer composition according to the present invention which can also be applied for a lithographic printing plate having a nega-type photosensitive layer, there may preferably be employed alkali metal salts, alkaline earth metal salts or ammonium salts of sulfurous acid, as exemplified by sodium sulfite, potassium sulfite, lithium sulfite, magnesium sulfite, and the like. More preferably, there may be employed an alkali metal salt or an alkaline earth metal salt free from generation of odor, especially sodium salt or potassium salt.

These sulfites may be contained in the developer composition in an amount of 0.001 to 30% by weight, preferably 0.01 to 10% by weight.

In the following, there are set forth preferred embodiments of the present invention:

(1) A developer composition according to the main claim wherein the reducing inorganic salt is an alkali metal salt of sulfurous acid.
(2) A developer composition for use in both of a lithographic printing plate material having a nega-type photosensitive layer containing a photosensitive diazo compound and an organic polymer, and a lithographic printing plate material having a posi-type photosensitive layer containing an o-quinonediazide compound and an organic polymer, characterized in that it is an alkaline aqueous solution of pH 11 or higher containing a water-soluble sulfurous acid salt.

The present invention is described in further detail below by referring to the following Examples, by which the present invention is not limited at all.

EXAMLE 1

An aluminum plate with a thickness of 0.24 mm, which had been subjected to sand graining according to the electrolytic etching method, then to the anodic oxidation treatment and further to hot water sealing treatment, was coated with a photosensitive solution as shown below by means of a rotary coating machine, followed by drying at 100° C. for 4 minutes, to provide a lithographic printing plate material:

| | |
|---|---|
| Condensate of naphthoquinone-(1,2)-diazide-(2)-5-sulfonic acid chloride with resorcin-benzaldehyde resin (as disclosed in Japanese Provisional Patent Publication No. 1044/1981, Example 1) | 3.5 g |
| m-Cresol-formaldehyde novolac resin "MP-707" (produced by Gun-ei Kagaku Kogyo Co. Ltd.) | 9 g |
| Naphthoquinone-(1,2)-diazide-(2)-4-sulfonic acid chloride | 0.15 g |
| Victoria Pure Blue BOH(produced by Hodogaya Kagaku Kogyo Co. Ltd.) | 0.2 g |

| -continued | |
|---|---|
| Methyl cellosolve | 100 g |

The coated film after drying had a weight of 2.5 g/m$^2$. A posi-type transparent original was placed in close contact on the lithographic printing plate material and exposed to light, using a 2 KW metal halide lamp as light source, at a radiation luminosity of 8.0 mw/cm$^2$ for 70 seconds. There were prepared two samples in this manner and they were developed with the developer compositions (I) and (II) as shown below, respectively, by means of an automatic developing machine for PS plate "PSA860" (produced by Konishiroku Photo Industry Co., Ltd.).

DEVELOPER COMPOSITION I

| | |
|---|---|
| Sodium silicate (Sodium silicate No. 3 according to the Japanese Industrial Standard) | 1335 g |
| Sodium hydroxide | 115 g |
| Water | 30 g |

The above composition was diluted to 7-fold with water.

DEVELOPER COMPOSITION II

This was prepared by incorporating 3% by weight of sodium sulfite into Developer composition I.

After development, the non-image portions were eradicated with an eradicating solution "SIR-1" (produced by Konishiroku Photo Industry Co., Ltd.). After washing with water, a developing ink "SPO-1" (produced by Konishiroku Photo Industry Co., Ltd.) was applied onto the resultant plate, and the developing capacity of the developer composition was evaluated by the state of inking of the developing ink at the brim of the trace of the eradicating solution adhered. Subsequently, these developer compositions were left to stand in the automatic developing machine for half a day, and the same procedure was repeated for respective developer compositions to make comparison therebetween as to the degree of fatigue thereof. The results are shown in Table 1.

TABLE 1

| | Presence of staining at the brim of the trace after eradication | |
|---|---|---|
| | No lapse of time | After half a day |
| Developer I | None | Do |
| Developer II | None | None |

As apparently seen from Table 1, the developer composition containing sodium sulfite is not deteriorated in developing capacity with lapse of time. As the next step, the two printing plates developed with the developer compositions after elapse of half a day were used to print on a printing machine "Hamadaster CDX900" (produced by Hamada Seisakusho Co., Ltd.). As the result, no ground staining was observed to be generated in the printing plate developed with Developer composition II even after printing of 200,000 sheets, while ground staining generated in the printing plate developed with Developer composition I after printing of 150,000 sheets.

EXAMPLE 2

An aluminum plate with a thickness of 0.24 mm, which had been subjected to sand graining according to the brush polishing method and then to the anodic oxidation treatment was coated with a photosensitive solution as shown below by means of a rotary coating machine, followed by drying at 100° C. for 4 minutes, to provide a lithographic printing plate material:

PHOTOSENSITIVE SOLUTION

| | |
|---|---|
| Condensate of naphthoquinone-(1,2)-diazide-(2)-5-sulfonic acid chloride with pyrogallol-acetone resin(synthesized similarly as in Example 1 disclosed in U.S. Pat. no. 3,635,709) | 3.5 g |
| m-Cresol-formaldehyde resin (produced by Sumitomo Bakelite Co. Ltd.) | 8 g |
| p-t-Butylphenol-formaldehyde resin | 0.15 g |
| Oil Blue #603 (produced by Orient Kagaku Co., Ltd.) | 0.1 g |
| Crystal Violet | 0.1 g |
| Methyl cellosolve acetate | 100 g |

The amount of the coating after drying was found to be 2.4 g/m². A Brunner chart system and a step tablet (No. 2 produced by Eastman Kodak Co.) were placed in close contact on the lithographic printing plate material, followed by exposure to light, using a 2 KW metal halide lamp as light source at a radiation luminosity of 8.0 mW/cm² for 70 seconds. Two samples were prepared and developed with the two kinds of the Developer compositions I, II as used in Example 1, respectively. When developed with Developer composition II, there was observed substantially no red color formation due to the coupling reaction of o-quinonediazide at the halftone and application of developing ink gave the result that all the dots were reproduced faithfully without overlapping and also excellent in resolving power. On the other hand, when developed with Developer composition I, red color formation was observed markedly at the halftone and application of developing ink gave the result that dots were overlapped with each other, falling to reproduce 97% of the shadow portion. Further, the resolving power was also inferior to the former.

EXAMPLE 3

The same aluminum plate as used in Example 1 was coated with a photosensitive solution shown below and dried to obtain a lithographic printing plate material.

| | |
|---|---|
| Condensate of naphthoquinone-(1,2)-diazide-(2)-5-sulfonic acid chloride with m-cresol-formaldehyde resin (degree of condensation: 30 mole %) | 3.5 g |
| Copolycondensed resin of phenol, a mixture of m-, p-cresols, and formaldehyde (molar ratio of phenol to cresols: 3:7; weight average molecular weight: 1500) | 8 g |
| Naphthoquinone-(1,2)-diazide-(2)-4-sulfonic acid chloride | 0.15 g |
| Oil Blue #603 (produced by Orient Kagaku Kogyo Co., Ltd. | 0.2 g |
| Ethyl cellosolve | 100 g |

The coated film after drying had a weight of 2.5 g/m². The lithographic printing plate material was developed with developer composition III after being exposed similarly as in Examples 1, 2.

DEVELOPER COMPOSITION III

| | |
|---|---|
| Sodium silicate (JIS sodium silicate No. 3) | 332 g |
| Aqueous potassium hydroxide solution (48% by weight) | 191 g |

The above components were diluted to 7-fold with water and 0.5% by weight of sodium hydrogen sulfite was incorporated into the solution to give a developer composition.

As the result, the exposed portion was completely dissolved with Developer composition III, the dots at the shadow portion reproduced faithfully and good results also obtained in printing test similarly as in Example 1.

EXAMPLE 4

An aluminum plate with a thickness of 0.24 mm was defatted by immersing in an aqueous 20% sodium phosphate solution and then subjected to electrolytic etching in a 0.2 N HCl bath at a current density of 3 A/m², followed by anodic oxidation in a sulfuric acid bath. The anodic oxidation was thereby effected to a quantity of 2 g/m². Further, sealing treatment was applied on the resultant plate with an aqueous sodium metasilicate to provide an aluminum plate to be used for lithographic printing plate. As the next step, the following photosensitive solution was coated by means of a whirler and dried at 85° C. for 3 minutes to provide a lithographic printing plate material.

| | |
|---|---|
| Copolymer of N—(4-hydroxyphenyl)methacrylamide: acrylonitrile:ethyl acrylate:methacrylic acid = 27:33:41:6 (weight ratio) (acid value:80; synthesized according to the method as disclosed in Example 1 in Japanese Provisional Patent Publication No. 155355.1980 | 50 g |
| Hexafluorophosphoric acid salt of paraformaldehyde condensate of p-diazodiphenylamine | 0.5 g |
| Julico AC10L (produced by Nippon Junyaku Co., Ltd.) | 0.05 g |
| Tartaric acid | 0.05 g |
| Victoria Pure Blue BOH (produced by Hodogaya Kagaku Co., Ltd.) | 0.1 g |
| Novolac resin PP-3121 (produced by Gun-ei Kagaku Kogyo Co. Ltd.) | 0.15 g |
| Pluronic L-64 (produced by Asahi Denka Co., Ltd.) | 0.005 g |
| Methyl cellosolve | 100 ml |

The resultant lithographic printing plate material was subjected to imagewise exposure by a metal halide lamp "Idolphin 2000" (produced by Iwasaki Denki Co., Ltd.) under the conditions of 8.0 mW/cm² for 30 seconds and developing treatment conducted with the developer composition shown below, using an automatic developing machine PSA-860 for PS plate (produced by Konishiroku Photo Industry Co., Ltd.).

DEVELOPER COMPOSITION IV

| | |
|---|---|
| Sodium silicate (JIS sodium silicate No. 3) | 332 g |
| Aqueous potassium hydroxide solution (48% by weight) | 191 g |

The above components were diluted to 7-fold with water and incorporated with 0.5% by weight of sodium sulfite to give the developer composition.

As the result of development, there was obtained a lithographic printing plate in which the unexposed portion was completely dissolved away. When this printing plate was applied to the same printing machine as in Example 1, there were obtained good printings without generation of ground staining up to printing of 200,000 sheets. In contrast, when the above lithographic printing plate material was subjected to a developing treatment with a developer obtained by removing sodium sulfite from Developer IV, the unexposed portion cannot completely be dissolved away. Then, this plate was applied similarly to the printing machine, whereby ground staining was observed to be generated after printing of 2000 sheets. Also, when the posi-type lithographic printing plate material in Example 1 was subjected to imagewise exposure, developed with Developer composition IV and applied similarly to the printing machine, there wre obtained good printings. As described above, operational efficiency was markedly improved, since the treatment of a posi-type lithographic printing plate material and a nega-type lithographic printing plate material can be performed with the same developer by means of the same automatic developing machine.

We claim:

1. A method of developing a posi-type lithographic printing plate having a sanded, anodically oxidized aluminum plate as a support with an imagewise exposed posi-type photosensitive layer thereon, said layer containing a photosensitive o-quinonediazide compound and an organic polymer, said method comprising developing said printing plate with an aqueous inorganic alkali solution containing a sufficient quantity amount of an inorganic alkali agent and a reducing inorganic salt selected from the group consisting of at least one inorganic salt of sulfurous acid and phosphorous acid to remove exposed portions with substantially no ground stain occurring on the printing plate.

2. The method of claim 1, wherein the reducing inorganic salt is an alkali metal salt of sulfurous acid.

3. The method of claim 2, wherein the reducing inorganic salt is at least one salt selected from the group consisting of sodium sulfite, potassium sulfite, lithium sulfite, sodium hydrogen sulfite and potassium hydrogen sulfite.

4. The method of claim 1, wherein said reducing inorganic salt is present in an amount of 0.001 to 30% by weight based on the weight of said aqueous inorganic alkali solution.

5. The method of claim 4, wherein said reducing inorganic salt is present in an amount of 0.01 to 10% by weight.

6. The method of claim 1, wherein the inorganic alkali agent is selected from the group consisting of sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium carbonate, potassium carbonate, sodium hydrogen carbonate, monoethanolamine, diethanolamine, triethanolamine, sodium metasilicate and potassium metasilicate.

7. The method of claim 6, wherein said inorganic alkali agent is selected from the group consisting of sodium silicate, potassium silicate, sodium metasilicate and potassium metasilicate.

8. The method of claim 1, wherein said aqueous inorganic alkali solution contains substantially no organic solvents and surfactants.

9. The method of claim 1, wherein the pH of the aqueous inorganic alkali solution is at least 11.

10. The method of claim 1, wherein the reducing inorganic salt is present in an amount of 0.01 to 10% by weight and is at least one salt selected from the group consisting of sodium sulfite, potassium sulfite, lithium sulfite, sodium hydrogen sulfite and potassium hydrogen sulfite and wherein said inorganic alkali agent is selected from the group consisting of sodium silicate, potassium silicate, sodium metasilicate and potassium metasilicate.

11. A method of developing (i) a posi-type lithographic printing plate having a sanded, anodically oxidized aluminum plate as a support with an imagewise exposed posi-type photosensitive layer thereon, said imagewise exposed posi-type photosensitive layer containing a photosensitive o-quinonediazide compound and an organic polymer; and (ii) a nega-type lithographic printing plate having a sanded, anodically oxidized aluminum plate as a support with an imagewise exposed nega-type photosensitive layer thereon, said imagewise exposed posi-type photosensitive layer containing a photosensitive diazo compound and an organic polymer, said method comprising developing said posi-type and nega-type printing plates with an aqueous inorganic alkali solution containing a sufficient quantity amount of an inorganic alkali agent and a reducing inorganic salt selected from the group consisting of at least one inorganic salt of sulfurous acid, said inorganic alkali solution having a pH of at least 11 to thereby remove exposed portions from said posi-type printing plate with substantially no ground staining occurring on said posi-type printing plate and to thereby remove unexposed portions from said nega-type printing plate with substantially no ground staining occurring on said nega-type printing plate.

12. The method of claim 11, wherein the reducing inorganic salt is an alkali metal salt of sulfurous acid.

13. The method of claim 12, wherein the reducing inorganic salt is at least one salt selected from the group consisting of sodium sulfite, potassium sulfite, lithium sulfite, sodium hydrogen sulfite and potassium hydrogen sulfite.

14. The method of claim 11, wherein said reducing inorganic salt is present in an amount of 0.001 to 30% by weight based on the weight of said aqueous inorganic alkali solution.

15. The method of claim 14, wherein said reducing inorganic salt is present in an amount of 0.01 to 10% by weight.

16. The method of claim 11, wherein the inorganic alkali is selected from the group consisting of sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium carbonate, potassium carbonate, sodium hydrogen carbonate, monoethanolamine, diethanolamine, triethanolamine, sodium metasilicate and potassium metasilicate.

17. The method of claim 16, wherein said inorganic alkali is selected from the group consisting of sodium silicate, potassium silicate, sodium metasilicate and potassium metasilicate.

18. The method of claim 11 wherein said aqueous inorganic alkali solution contains substantially no organic solvents and surfactants.

19. The method of claim 11, wherein the reducing inorganic salt is present in an amount of 0.01 to 10% by weight and is at least one salt selected from the group consisting of sodium sulfite, potassium sulfite, lithium sulfite, sodium hydrogen sulfite and potassium hydrogen sulfite and wherein said inorganic alkali is selected from the group consisting of sodium silicate, potassium silicate, sodium metasilicate and potassium metasilicate.

* * * * *